United States Patent
Litchfield

(10) Patent No.: US 8,579,360 B2
(45) Date of Patent: Nov. 12, 2013

(54) APPARATUS FOR REDUCING DRAG ON A VEHICLE

(71) Applicant: Lonnie Litchfield, Oklahoma City, OK (US)

(72) Inventor: Lonnie Litchfield, Oklahoma City, OK (US)

( * ) Notice: Subject to any disclaimer, the term of this patent is extended or adjusted under 35 U.S.C. 154(b) by 0 days.

(21) Appl. No.: 13/789,055

(22) Filed: Mar. 7, 2013

(65) Prior Publication Data

US 2013/0181478 A1 Jul. 18, 2013

Related U.S. Application Data

(63) Continuation of application No. 12/511,577, filed on Jul. 29, 2009, now Pat. No. 8,402,242.

(51) Int. Cl.
*B62D 35/00* (2006.01)

(52) U.S. Cl.
USPC ..................................... 296/180.4; 296/180.1

(58) Field of Classification Search
USPC .......................................... 296/180.1–180.5
See application file for complete search history.

(56) References Cited

U.S. PATENT DOCUMENTS

| | | | |
|---|---|---|---|
| 4,236,745 A | 12/1980 | Davis | |
| 4,320,919 A | 3/1982 | Butler | |
| 4,343,506 A | 8/1982 | Saltzman | |
| 4,789,117 A | 12/1988 | Paterson et al. | |
| 4,818,015 A | 4/1989 | Scanlon | |
| 5,058,945 A | 10/1991 | Elliott et al. | |
| 5,108,145 A | 4/1992 | Harris | |
| 5,240,306 A | 8/1993 | Flemming | |
| 5,289,997 A | 3/1994 | Harris | |
| 5,332,280 A | 7/1994 | DuPont et al. | |
| 5,947,548 A | 9/1999 | Carper et al. | |
| 6,409,252 B1 | 6/2002 | Andrus | |
| 6,616,218 B2 | 9/2003 | Bauer et al. | |
| 6,634,700 B1 | 10/2003 | Calvert | |
| 6,877,793 B2 | 4/2005 | Cory | |
| 6,959,958 B2 | 11/2005 | Basford | |
| 7,059,662 B1 | 6/2006 | Drews | |
| 7,147,270 B1 | 12/2006 | Andrus et al. | |
| 7,192,077 B1 | 3/2007 | Hilleman | |
| 7,243,980 B2 | 7/2007 | Vala | |
| 7,255,387 B2 | 8/2007 | Wood | |
| 7,537,270 B2 | 5/2009 | O'Grady | |
| 7,578,541 B2 | 8/2009 | Layfield et al. | |
| 7,740,304 B1 | 6/2010 | Breu | |
| 7,810,867 B2 | 10/2010 | Salaverry | |
| 8,079,634 B2 | 12/2011 | Visser et al. | |
| 8,141,936 B2 | 3/2012 | Salaverry | |
| 2003/0011210 A1 | 1/2003 | Cory | |
| 2003/0205913 A1 | 11/2003 | Leonard | |
| 2006/0066132 A1 | 3/2006 | Page | |
| 2007/0001481 A1 | 1/2007 | Breidenbach | |
| 2007/0046066 A1 | 3/2007 | Cosgrove et al. | |
| 2009/0096250 A1 | 4/2009 | Kohls | |
| 2009/0230725 A1 | 9/2009 | Juieng | |
| 2010/0301632 A1 | 12/2010 | Bryne | |
| 2011/0068603 A1 | 3/2011 | Domo et al. | |

*Primary Examiner* — Lori Lyjak
(74) *Attorney, Agent, or Firm* — Hall Estill Law Firm

(57) ABSTRACT

The present invention is directed to a device for reducing drag on a vehicle. The device comprises a sheet of material and a plurality of depressions/elevations. The sheet of material having a base portion and an apex extending from the base portion.

10 Claims, 4 Drawing Sheets

APPARATUS FOR REDUCING DRAG ON A VEHICLE

CROSS-REFERENCE TO RELATED APPLICATIONS

The present application is a continuation of U.S. patent application Ser. No. 12/511,577, filed Apr. 12, 2012, which is a conversion of U.S. Provisional Application Ser. No. 61/475,328, filed Apr. 14, 2011 which claims the benefit under 35 U.S.C. 119(e). The entire disclosures of which are hereby expressly incorporated herein by reference.

STATEMENT REGARDING FEDERALLY SPONSORED RESEARCH OR DEVELOPMENT

Not applicable.

BACKGROUND OF THE INVENTION

1. Field of the Invention

The present invention relates to a drag reduction device attachable to a rear portion of a vehicle to reduce drag on the vehicle. In addition, the present invention is directed to a method of producing and implementing the drag reduction device.

2. Description of the Related Art

Drag reduction devices for vehicles have been implemented in the past. The past drag reduction devices were limited in the percent of reduction to the vehicle they could provide. Accordingly, there is a need for a drag reduction device that provides a large drag reduction for a vehicle to ultimately reduce fuel costs.

SUMMARY OF THE INVENTION

This invention relates to a device for reducing drag on a vehicle. The device includes a sheet of material shaped to fit a rear portion of a vehicle. The sheet of material having a base portion and an apex extending a specific distance from the base portion. The sheet of material also includes a plurality of depressions and/or elevations disposed on the sheet of material to reduce the drag on the vehicle.

DETAILED DESCRIPTION OF THE INVENTION

Figure 1:
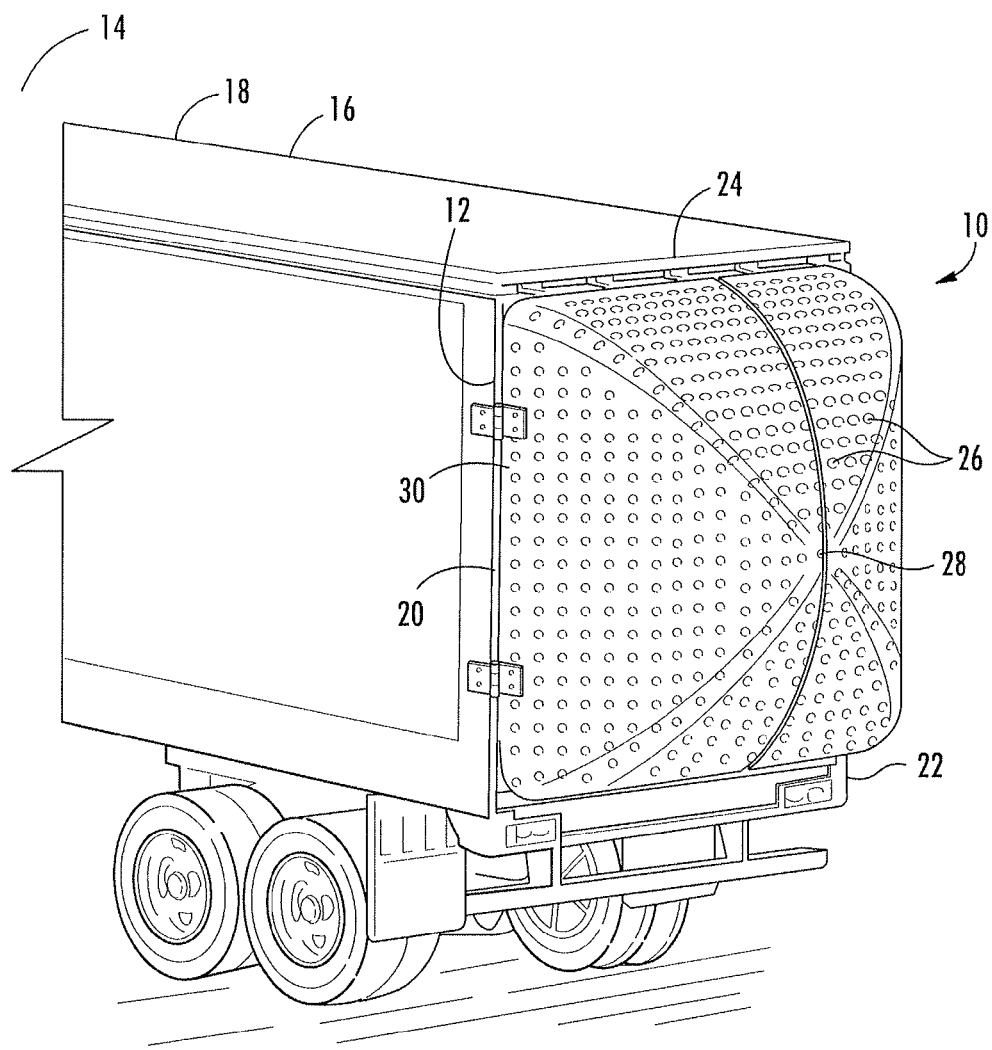
FIG. 1 is a perspective view of a drag reduction device attached to a trailer and constructed in accordance with one embodiment of the present invention.

The present invention relates to a drag reduction device/apparatus 10 attachable to a rear portion 12 of a vehicle 14 (not shown) or trailer 16 of a vehicle 14 to reduce wind drag on the vehicle 14. It should be understood that the drag reduction device 10 disclosed herein can be implemented on any type of vehicle 14 to reduce drag on the vehicle 14. In an exemplary embodiment of the present invention, the drag reduction device 10 will be disclosed herein in more detail for use on the rear portion 12 of the trailer 16 of a semi-trailer truck 18.

Figure 2:
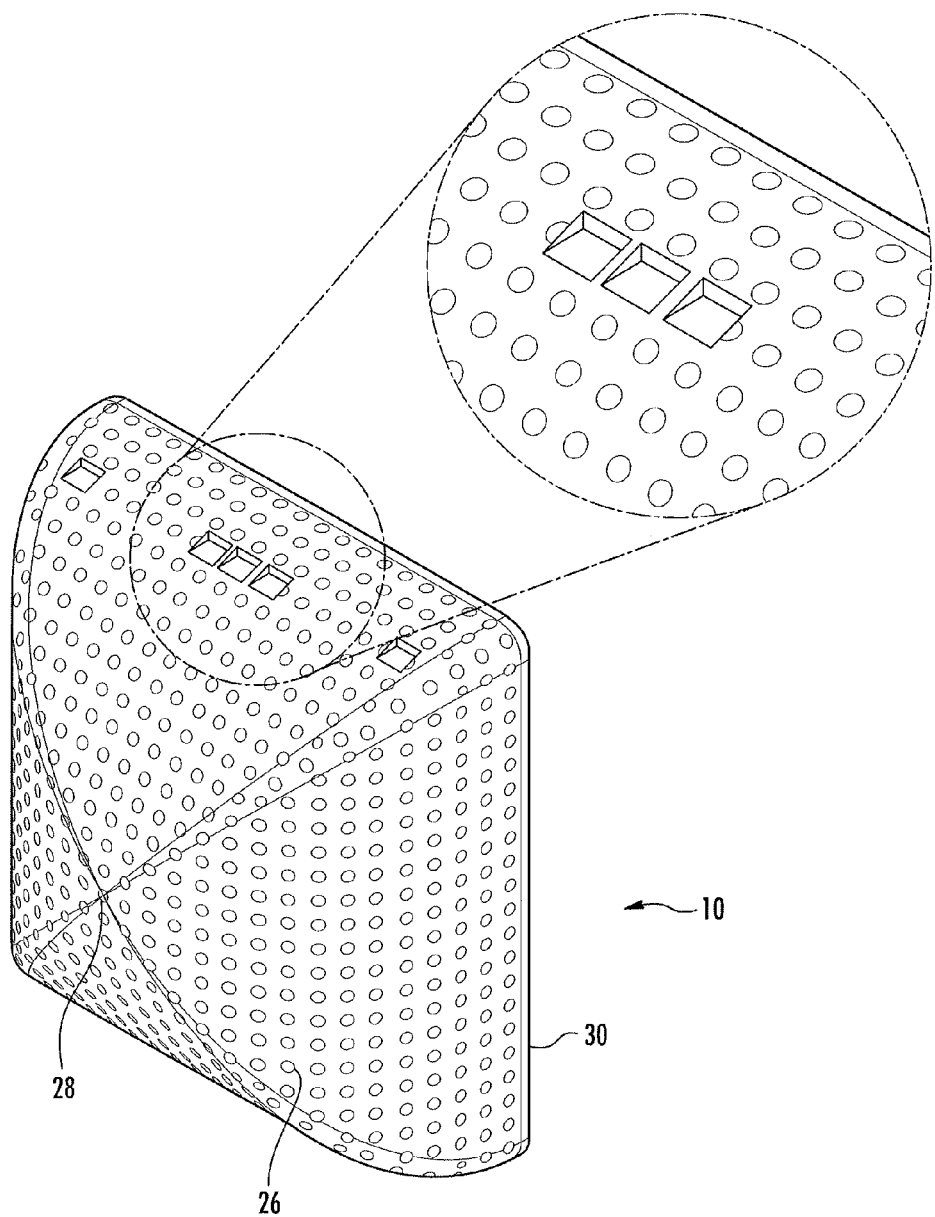
FIG. 2 is a perspective view of the drag reduction device constructed in accordance with one embodiment of the present invention.
Figure 3:
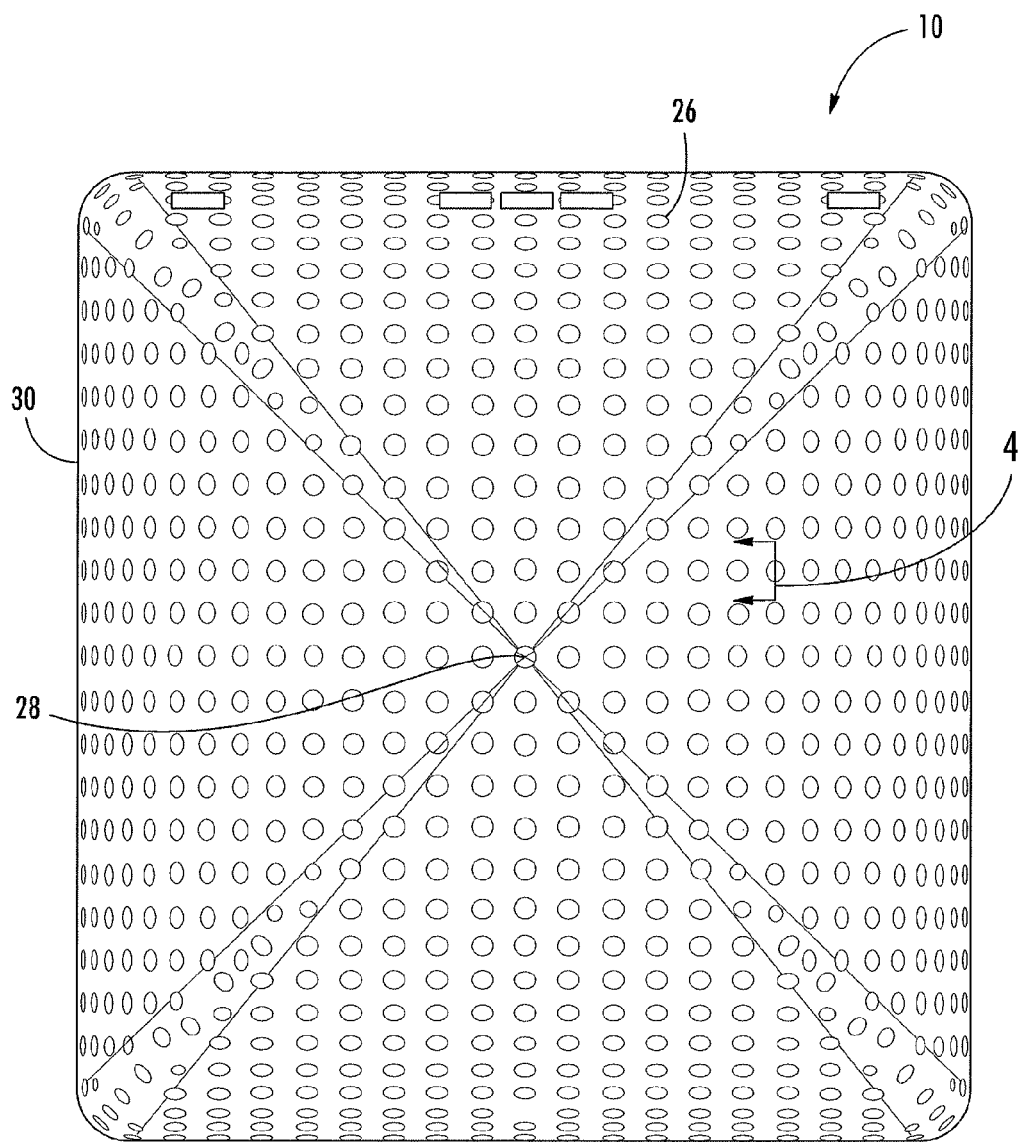
FIG. 3 is a front elevation view of the drag reduction device constructed in accordance with one embodiment of the present invention.

In one embodiment of the present invention, as shown in FIGS. 1, 2 and 3, the drag reduction device 10 is constructed of a sheet of material and is attached to (or supported by) the rear portion 12 of the trailer 16 of a semi-trailer truck 18. The rear portion 12 of the trailer 16 having a left corner portion 20, a right corner portion 22 and a top corner portion 24. The drag reduction device 10 can be attached to the trailer 16 in any manner known in the art. In one embodiment of the present invention, the drag reduction device 10 is hingedly attached to the left corner portion 20 or the right corner portion 22 of the trailer 16. In another embodiment of the present invention, the drag reduction device 10 can be hingedly attached to the top corner portion 24 of the trailer 16. In a further embodiment, a pneumatic arm can be implemented to lift the drag reduction device 10 upwardly when the drag reduction device 10 is hingedly attached to the top corner portion 24 of the trailer 16.

In a further embodiment, the drag reduction device 10 is provided with a plurality of depressions 26 to further reduce the drag on the vehicle 14. It should be understood that the depressions 26 in the drag reduction device 10 can be any shape and depth so as to increase drag reduction on the vehicle 14. In one exemplary embodiment of the present invention, the depressions 26 are circular-shaped depressions (i.e. dimples). It should be understood that the plurality of depressions 26 can cover any portion of the drag reduction device 10. For example, the depressions 26 can cover substantially all of the drag reduction device 10 or the depressions 26 can cover any portion of the drag reduction device 10 less than substantially all of the drag reduction device 10.

Figure 4:
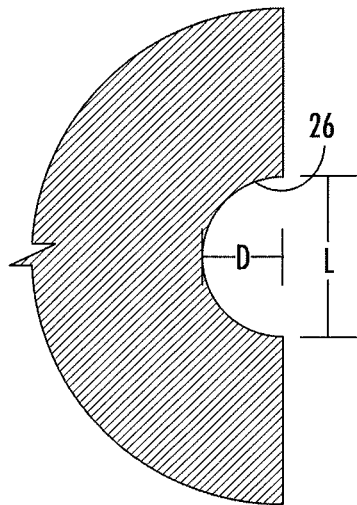
FIG. 4 is a cross-sectional view of a depression disposed on the drag reduction device constructed in accordance with one embodiment of the present invention.

Shown in FIG. 4, the circular-shaped depressions 26 can have a diameter L and a depth D. The depressions 26 can have a diameter L in a range of from about $\frac{1}{8}^{th}$ of an inch to about 8 inches. In another embodiment, the depressions 26 can have a diameter L in a range of from about 0.5 inches to about 4 inches. In a further embodiment of the present invention, the diameter L can be about 1.5 inches to about 3.5 inches. The depressions 26 can have a depth D in a range of from about $\frac{1}{16}^{th}$ of an inch to about 6 inches. In another embodiment of the present invention, the depressions 26 can have a depth D in a range of from about $\frac{1}{8}^{th}$ of an inch to about 2 inches. In a further embodiment, the depressions 26 can have a depth D in a range of from about 0.25 inches to about 0.75 inches.

In a further embodiment of the present invention, the drag reduction device 10 can be provided with elevations to reduce the drag on the vehicle 14. The elevations can be any shape such that drag is reduced on the vehicle 14.

In another embodiment of the present invention, the drag reduction device 10 is comprised of more than one piece. For example, the drag reduction device 10 is constructed of separate pieces. In this embodiment, one piece of the drag reduction device 10 is mounted to the left corner portion 20 of the trailer 16 and the other piece of the drag reduction device 10 is attached to the right corner portion 22 of the trailer 16. In this embodiment, the two pieces that make up the drag reduction device 10 can be secured together via any manner known in the art. It should be understood and appreciated that the pieces of the drag reduction device 10 can be hingedly attached to the trailer 16 or staticly secured to rear doors of the trailer 16.

Figure 5:
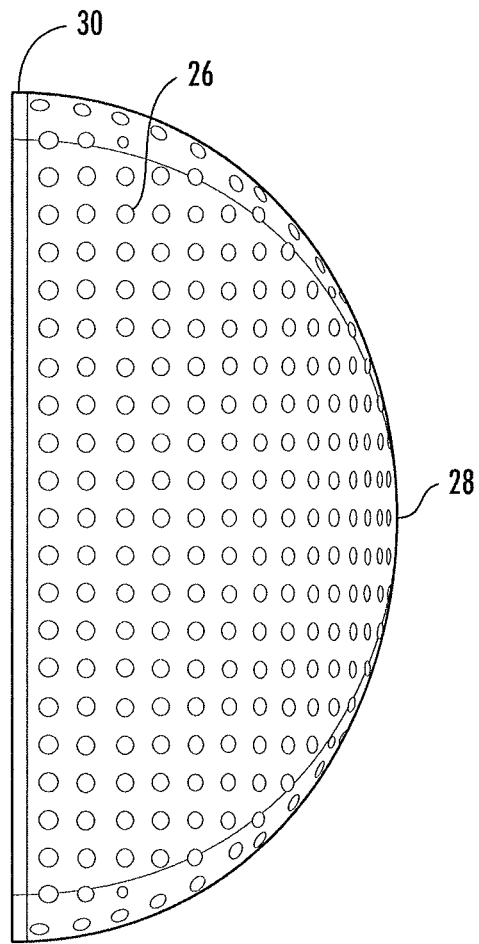
FIG. 5 is a side elevation view of the drag reduction device constructed in accordance with one embodiment of the present invention.

In one embodiment shown in FIG. 5, the drag reduction device 10 can be shaped in any way such that drag is reduced on the vehicle 14 the drag reduction device 10 is attached to. In an exemplary embodiment, the drag reduction device 10 is shaped like a square dome and has an apex 28. The apex 28 extending a certain distance from a base portion 30 of the drag reduction device 10. In an embodiment, the distance of the apex 28 from the base portion 30 of the drag reduction device 10 is in a range of from about 1 foot to about 5 feet. In another embodiment, the distance of the apex 28 from the base portion 30 of the drag reduction device 10 is in a range of from about 3.5 feet to about 5 feet.

The drag reduction device 10 can be constructed of any material such that the drag reduction device 10 can handle the forces applied to it while attached to the vehicle 14 while the vehicle 14 is traveling at high rates of speeds. Examples of materials include, but are not limited to, hard plastics, fiberglass, and/or lightweight composites.

The drag reduction device 10 can also be designed such that any warning lights or signals used in the operation of the vehicle 14 and trailer 16 will either not be impeded or will be implemented in the drag reduction device 10.

From the above description, it is clear that the present invention is well adapted to carry out the objectives and to attain the advantages mentioned herein as well as those inherent in the invention. While presently preferred embodiments of the invention have been described for purposes of this disclosure, it will be understood that numerous changes may be made which will readily suggest themselves to those skilled in the art and which are accomplished within the spirit of the invention disclosed and claimed.

What is claimed is:

1. A device for reducing drag on a vehicle, the device comprising:

a sheet of material shaped to fit a rear portion of a vehicle, the sheet of material having a base portion and an apex extending a specific distance from the base portion; and
   a plurality of depressions disposed on the sheet of material to reduce the drag on the vehicle.

2. The device of claim 1 wherein the plurality of depressions are circular-shaped and have a diameter and a depth.

3. The device of claim 2 wherein the diameter of the circular-shaped depressions is in a range selected from the group consisting of from about $1/8^{th}$ of an inch to about 8 inches, from about 0.5 inches to about 4 inches, and from about 1.5 inches to about 3.5 inches.

4. The device of claim 1 wherein the apex extends from the base portion a distance in a range selected from the group consisting of from about 1 foot to about 5 feet and from about 3.5 feet to about 5 feet.

5. The device of claim 2 wherein the depth of the circular-shaped depressions is in a range of from about $1/16^{th}$ of an inch to about 6 inches.

6. The device of claim 2 wherein the depth of the circular-shaped depressions is in a range of from about $1/8^{th}$ of an inch to about 2 inches.

7. The device of claim 2 wherein the depth of the circular-shaped depressions is in a range of from about 0.25 inches to about 0.75 inches.

8. The device of claim 1 wherein the sheet of material is provided in a plurality of parts.

9. The device of claim 1 wherein the sheet of material can be hingedly attached to the rear portion of the vehicle and the rear portion of the vehicle is the rear portion of a trailer of a tractor-trailer truck.

10. The device of claim 1 wherein the depressions cover substantially all of the sheet of material.

* * * * *